United States Patent [19]

Castellano, Jr. et al.

[11] Patent Number: 4,599,558

[45] Date of Patent: Jul. 8, 1986

[54] PHOTOVOLTAIC IMAGING FOR LARGE AREA SEMICONDUCTORS

[75] Inventors: Anthony J. Castellano, Jr., New Fairfield, Conn.; Thomas H. DiStefano, Bronxville; Robert S. Olyha, Jr., Yonkers, both of N.Y.

[73] Assignee: IBM, N.Y.

[21] Appl. No.: 561,364

[22] Filed: Dec. 14, 1983

[51] Int. Cl.[4] .................... G01R 31/26; H01L 21/66
[52] U.S. Cl. ................... 324/158 R; 29/574; 324/158 D
[58] Field of Search ........... 324/158 D, 158 R, 73 R; 29/574; 356/237

[56] References Cited

U.S. PATENT DOCUMENTS 4,051,437  9/1977  Lile et al. ................ 324/158 D
4,287,473  9/1981  Sawyer .................... 324/158 D
4,333,051  6/1982  Goodman .................. 324/158 D

OTHER PUBLICATIONS

Philbrick et al.; "Scanned Surface Photovoltage Detection of Defects in Silicon Wafers"; IEEE 13th Annual Proceedings of Reliability Physics; 1975; pp. 159–167.

Primary Examiner—Ernest F. Karlsen
Attorney, Agent, or Firm—Sughrue, Mion, Zinn, Macpeak & Seas

[57] ABSTRACT

An imaging system for detecting recombination center defects in a semiconductor wafer in which an oxidized wafer is pre-treated by charging the oxide in a corona discharge and then passing the charged wafer below a stationary bifurcated electrode. A focused laser beam is scanned between the arms of the bifurcated electrode and along its length as the wafer is slowly moved transversely to the direction of laser scanning. The signal from the bifurcated electrode is displayed in an imaging system, one axis of which is synchronized to the laser scanning and the other axis is synchronized to the movement of the wafer.

16 Claims, 7 Drawing Figures

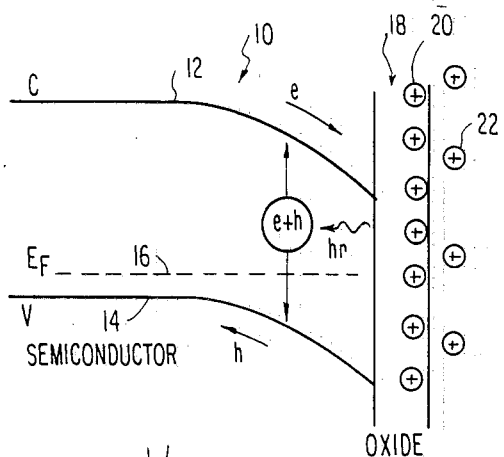
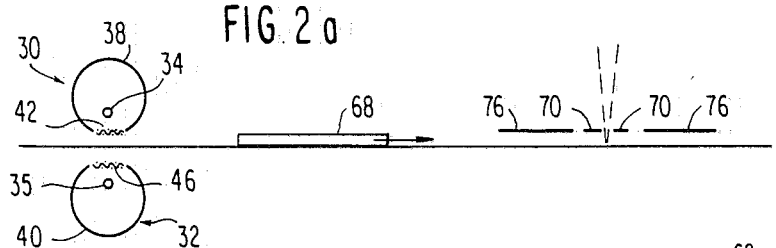
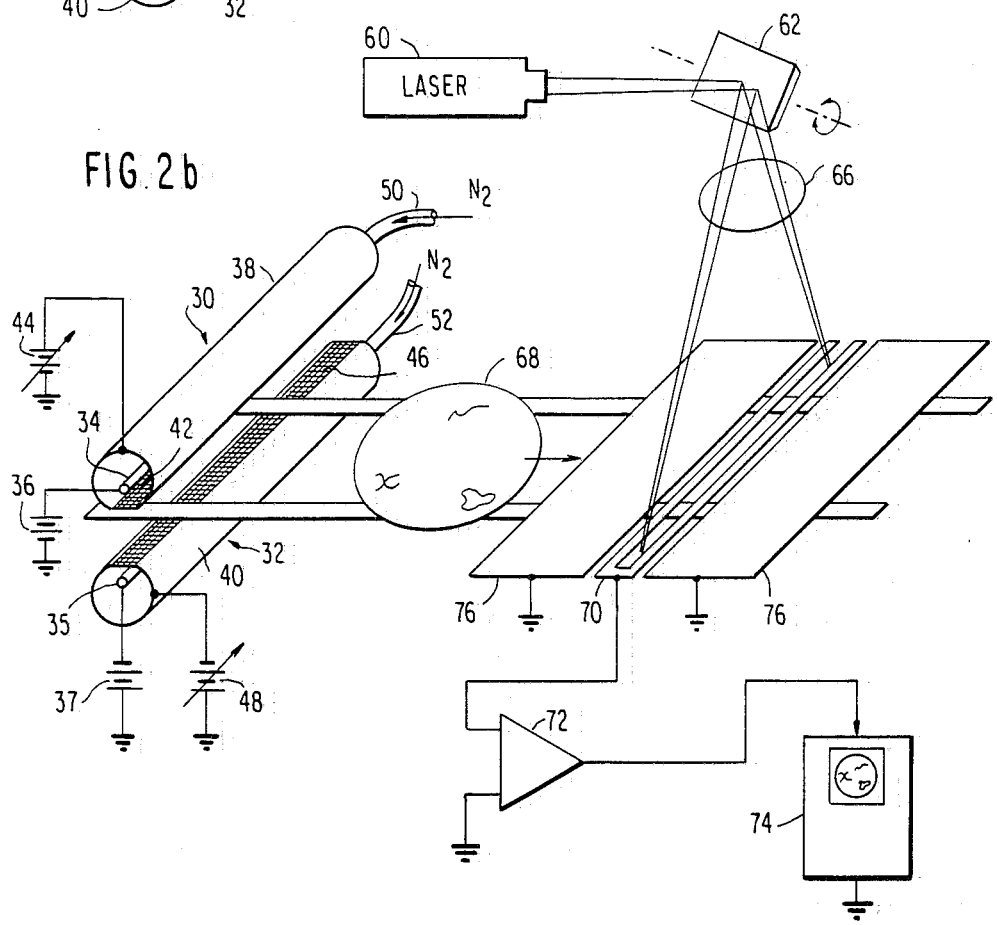

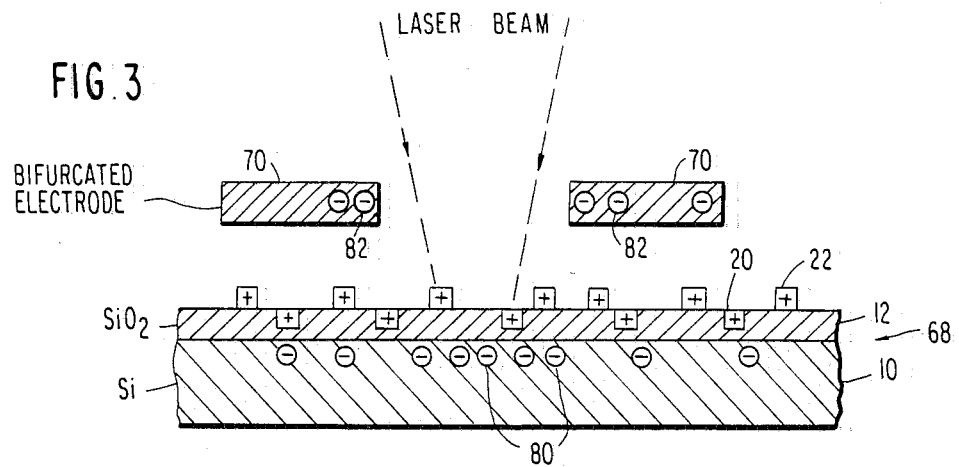
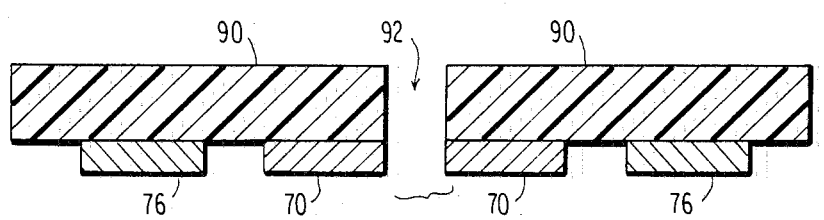
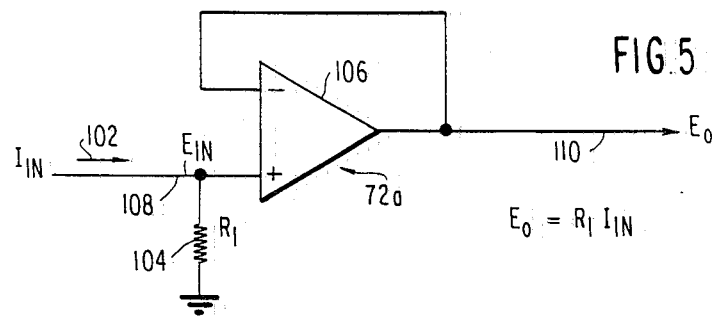
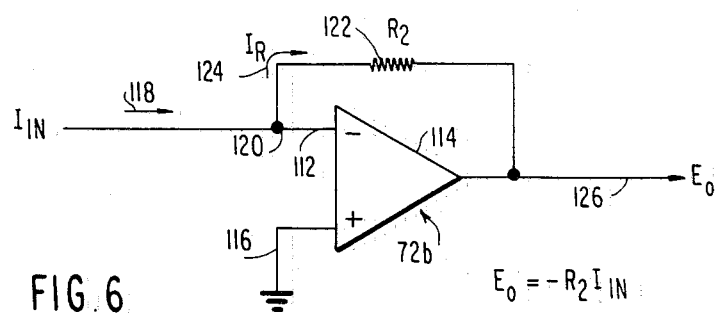

PHOTOVOLTAIC IMAGING FOR LARGE AREA SEMICONDUCTORS

BACKGROUND OF THE INVENTION

1. Technical Field

The invention relates generally to imaging a large surface area of a semiconductor material, and it relates, in particular, to a method and apparatus for inspecting for crystallographic defects in the region near the surface of the material.

2. Prior Art

The production of integrated circuits, particularly those of VLSI size and complexity, requires that defects in the underlying semiconductor substrate be tightly controlled and monitored. The presence of a defect may cause a device fabricated on top of the defect to be either inoperative or only marginally operative. If the integrated circuit fabrication is carried through to completion, the presence of an inoperable device among the many thousands contained within an integrated circuit can be established through exhaustive and time-consuming testing. For a complete check, the testing must be performed at different values of operating temperature, power supply voltages and signal levels. For complex VLSI, a complete check on a finished device becomes prohibitively expensive.

The location of the fault or defect can be localized within a complex integrated circuit by scanning a completed circuit with a small beam of radiation. Lockhart et al. in U.S. Pat. No. 4,309,657 raster scan an electron beam over the integrated circuit. Ager et al. in U.K. Patent Application No. 2,069,152 perform a similar scan with a laser beam over an integrated circuit for which the supply voltage is reduced to a minimum level. While both of these methods are useful for pinpointing the location of a defect, they still require complicated electronic testing equipment and further require that the integrated circuit be completely fabricated. Furthermore, their methods, being electrical tests, do not provide information as to the type of defect causing the problem. It is desirable to have available a method which can detect the presence of defects in a semiconductor wafer before fabrication has begun or during fabrication, so as to eliminate the expense of processing defective wafers. It is further desirable that the defect detection process provide some information as to the type of defect so that a corresponding processing fault can be corrected.

A visual inspection of the entire wafer is possible but is very time-consuming and thus expensive if defects on the order of 1 μm are to be detected. Steigmeier et al. in U.S. Pat. No. 4,314,763 disclose a method of wafer inspection in which a focused laser beam is scanned over the wafer. The intensity of the laser light reflected from the surface of the wafer is monitored and variations of the reflected intensity indicate the presence of defects at those locations on the wafer. While this method has the potential for fast and automated imaging of an entire wafer, it is in fact measuring the optical properties of the semiconductor material. Electrical defects, of overriding importance for integrated circuits, do not necessarily correspond to optical defects so that such a test method is incomplete.

In order to inspect and control silicon wafer quality, the current practice among integrated circuit manufacturers is to sample batches of wafers by means of a Zerbst technique. The sampled wafers are oxidized and then aluminum dot electrodes are evaporated onto the oxidized surface. Selected dots are probed electrically to determine the average minority carrier recombination rate. In practice, less than 1% of the surface area of the sampled wafer is actually probed in a typical test. Although this technique is useful in predicting device yield, this electrical test suffers many limitations. The test is destructive and cannot be used to characterize a specific wafer prior to device fabrication. The total area that is probed is only a small fraction of the total wafer area. Probing the entire surface would be very time consuming. Zerbst type measurements yield little or no information about the density or distribution of the defects on the surface. Finally, electrical probing is tedious and expensive. The wafer must be oxidized and then metallized with the aluminum dots. The individual dots must then be separately probed and analyzed.

Important electrical parameters which are affected by localized defects are the recombination rate, the minority carrier lifetime and the minority carrier diffusion length. These parameters are interrelated in well known semiconductor theory. Goodman, in U.S. Pat. No. 4,333,051, discloses a method of determining the minority carrier diffusion length in semiconductors by a measurement of the surface photovoltage in which an electrode is separated from an area of the semiconductor to be probed by an insulating layer and then light, shining through the electrode, produces a photogenerated charge which is detected across the electrode and a contact to the substrate of the semiconductor. However, the method of Goodman is too complex to easily provide an image of the entire wafer but is instead intended for a one-point measurement.

A similar technique is disclosed by Lile et al. in U.S. Pat. No. 4,051,437, in which a focused laser beam is scanned over the surface of a semiconductor material. One contact is made to the bulk semiconductor and another contact is made by either an MOS contact capacitively coupled into the semiconductor or by an aqueous electrolyte covering the surface through which the laser is directed. The laser beam generates a surface photo-voltage which is displayed in synchronism with the scanned laser beam to provide an image of the scanned semiconductor. This method provides a desirable type of display but appears capable of only limited resolution.

Philbrick and one of the present inventors have disclosed a device similar to that of Lile et al. in an article entitled "Scanned Surface Photovoltage Detection of Defects in Silicon Wafers" published in the 13th *Annual Proceedings of Reliability Physics*, pp. 159–167, 1975, in which the silicon is oxidized and a capacitively coupled electrode is placed over the oxide layer. Two-dimensional laser raster scanning produces large area imaging of the recombination centers at the surface of the semiconductor. Their method produces resolution of the order of 2 μm.

SUMMARY OF THE INVENTION

Accordingly, it is an object of this invention to provide large area imaging of electrical defects at the surface of a semiconductor by means of a non-contact test.

It is a further object of this invention to provide nondestructive imaging of defects in a semiconductor.

Yet a further object of this invention is to provide rapid defect imaging with high resolution over a large surface area of semiconductor material.

The invention can be summarized as a method and apparatus for imaging large area semiconductors by oxidizing at least one side of a semiconductor wafer, pre-treating both surfaces in a corona discharge and then passing the wafer beneath a linear electrode extending across the wafer and scanning a laser beam through an aperture and along the length of the linear electrode. Signals picked up by the linear electrode are proportional to the local minority carrier lifetime and can be imaged in synchronism with the laser scan and the wafer translation to provide an image of the surface recombination center defects in the wafer. The linear electrode may be bifurcated, with the scan aperture running between the two linear arms of the electrode. This configuration increases the coupling of the photovoltage signal to the detector electronics.

BRIEF DESCRIPTION OF THE DRAWINGS

FIG. 1 is an energy versus distance diagram at the interface between a semiconductor and an insulator;

FIGS. 2(a) and 2(b) are schematic illustrations in side and top view respectively of the defect imaging system of this invention;

FIG. 3 is an exploded view illustrating the generation and detection of surface photovoltage;

FIG. 4 is a cross-sectional view of a bifurcated electrode assembly; and

FIGS. 5 and 6 are schematic diagrams of two preamplifiers usable with this invention.

DETAILED DESCRIPTION OF THE PREFERRED EMBODIMENT OF THE INVENTION

The present invention is intended to operate according to the principles illustrated in the energy level versus distance diagram of FIG. 1. A semiconductor material 10 has a conduction band 12 and a valence band 14 separated by the semiconductor band-gap. If the semiconductor is p-type as illustrated, a Fermi level 16 lies relatively close to the valence band 14. The semiconductor 10 is overlaid with an oxide layer 18. Two types of positive charges are introduced into the oxide layer 18, charged surface states 20 and surface charge 22. The net effect of the charge is to bend the bands 12 and 14 relative to the Fermi level 16. Light penetrated into the semiconductor 10 through the oxide 18 creates electron-hole pairs. The negatively charged electrons are attracted to the surface of the semiconductor by the positive charge 20 and 22 in the oxide 18, while the positively charged holes are repelled into the bulk of the semiconductor. The electrons are minority carriers in p-type semiconductors. When they reach the interface between the semiconductor 10 and the oxide 18, they are measured by an apparatus to be described later. However, the number of electrons reaching the interface is determined by the minority lifetime or, alternatively, the recombination rate. Therefore in an area of the semiconductor 10, where a defect causes increased recombination or decreased minority lifetime, the number of electrons reaching the interface is reduced with a corresponding reduction in the signal. Thus a map of the detected signal of electrons at the surface will be an inverse map of the defect distribution affecting the minority lifetime in the semiconductor.

The wafer is first oxidized, both front and back although it has been found that oxidizing only the imaged surface produces satisfactory results. The naturally occurring native oxide of silicon provides a satisfactory oxide so that a separate oxidizing step is not required as long as the silicon has been exposed to oxygen. Alternatively, a wet or dry oxidizing step may be used. It has been found that if the silicon wafer already has had a metallization layer applied, the metallization does not interfere with the imaging of the neighboring oxidized silicon. In typical integrated circuit processing, even the metallization is covered with an oxide layer.

The silicon wafer is pretreated by being passed through a corona discharge station schematically illustrated in FIG. 2. The corona discharge station is composed of an upper corona discharge device 30 and a lower corona discharge device 32. Each of these corona discharge devices comprises a discharge rod 34 or 35 electrically connected to a DC high voltage power source 36 or 37 of appropriate polarity. Surrounding the discharge rod 34 or 35 is a cylindrically shaped, conductive housing 38 or 40. The lower section of the housing 38 of the upper corona discharge device 30 is replaced with a conductive mesh 42 that is also electrically connected to the cylindrical housing 38. The electrical potential of the cylindrical housing 38 and its associated mesh 42 is determined by a variable DC power source 44. Likewise, the cylindrical housing 40 of the lower discharge device 32 has an upward facing conductive mesh 46 and a DC power supply 48 supplying voltage to the cylindrical housing 40 and its corresponding mesh 46 of opposite polarity from the power supply 44 of the upper device 30. The axial extent of the two cylindrical housings 38 and 40 is sufficient to allow an entire semiconductor wafer to pass between the meshes 42 and 46. The opposing ends of each housing 38 or 40 are covered by caps (not shown). The upper and lower devices 30 and 32 are separated so that there is a distance of approximately 1 cm between the meshes 42 and 46. Nitrogen gas is introduced through tubes 50 and 52 so that it penetrates the housings 38 and 40 and flows over the discharge rods 34 and 35. An inert gas such as argon, neon, krypton or other non-reacting gases may alternatively be used for carrying the discharge. The discharge rods 34 and 35 ionize the gas as it moves toward and through the respective meshes 42 and 46. The potential of the gas flow onto the wafer is determined by the potential of the respective mesh 42 and 46. The oxidized silicon wafer lying upon an insulated or electrically floating stage, not shown, moves through the corona station at a slow speed of about 1–10 cm/sec. The surface of the semiconductor material is influenced by either charged surface states or surface charge in the oxide of the respective side of the wafer. It is not known what the distribution of charge is between the surface states and the surface charges but it is believed that both occur. The characteristics of the oxide are determined by the voltages applied by the DC power supplies 44 and 48 and these values can be varied to optimize the contrast in the obtained image. A somewhat different device for corona charging of semiconductor devices is provided by Szedon in U.S. Pat. No. 4,326,165.

After the oxidized silicon wafer has been pretreated in the corona discharge station, it is taken to the scanning station illustrated schematically in FIGS. 2(a) and 2(b). In practice, the wafer moves along a track at constant speed through the corona discharge station and from there to the scanning station, all at a constant speed of about 1 cm/sec. Many of the details of the scanning station are disclosed in the aforementioned article by Philbrick et al. In the scanning station, a laser 60 produces a narrow beam of light at a wavelength of 632.8 nm. At this wavelength, light penetrates into silicon a distance of 1.9 μm. The laser intensity is in the range of 1–10 mW. The laser beam is reflected from a mirror 62 which can be rotated about an axis 64 to produce a linear scan. A lens 66 focuses the laser beam to about 25 μm at the surface of a wafer 68. The focused laser beam is scanned between and along the length of the arms of a bifurcated electrode 70 extending across the wafer 68 transverse to the mechanical movement or slow scan of the wafer. The bifurcated electrode 70 is spaced above the wafer 68 by a distance of between 100 and 500 μm. The bifurcated electrode 70 is electrically connected to a preamplifier 72 which controls the display on a display system 74. The detection in the preamplifier 72 may be either voltage mode or current mode. The display system 74, which can use the techniques disclosed by Philbrick et al., has one axis of its display synchronized with the scanning of the laser beam and other axis synchronized with the mechanical movement of the wafer 68. A ground electrode 76 is in the same plane as the bifurcated electrode 70 and surrounds it. The ground electrode 76 establishes a ground plane for the detected area of the wafer. It may extend much further away from the bifurcated electrode 70. In another embodiment, the ground electrode may be connected to another grounding plate located between the bifurcated electrode and the lens 66 through an aperture of which the laser beam can shine. The ground of the ground electrode 76 is used by the preamplifier 72 as a reference for the detected signal.

The principle of operation for the imaging of defects is illustrated in the cross-sectional view of FIG. 3 in which the wafer 68 is composed of the semiconductor 10 and the overlying oxide layer 12. The lower oxide layer at the bottom of the semiconductor 10 is not illustrated in this figure. The charged surface states 20 and the surface charge 22 were established in the oxide at the corona discharge station. This charge 20 and 22 establishes the surface conditions on the wafer 68.

The laser beam directed onto the surface of the wafer 68 through the aperture of the bifurcated electrode 70 produces charge 80, in this case minority carriers, at the interface between the semiconductor 10 and the oxide 12 in the vicinity of the electrode aperture. The amount of the charge 80 at the interface is directly related to the minority carrier lifetime and is thus reduced when there are recombination defects in the vicinity of the laser beam. The charge at the interface 80 produces an image charge 82 in the bifurcated electrode 70. It is believed that the charge 80 at the interface is only partially imaged by the electrode charge 82 but it is not known what fraction is so imaged. However, the presence of a defect will reduce the interface charge 80 with a corresponding decrease in the electrode charge 82. The electrode charge 82 is detected by the preamplifier 72 and displayed in the display system 74. The bandwidth of the detector system extends from 1 kHz to 10 MHz. For imaging of the entire wafer, the laser beam is scanned along the length of the bifurcated electrode at about two hundred scans per second. Simultaneously, the wafer 68 is moving at a speed of approximately 1 cm/sec. tranversely to the scan of the laser beam. It has been found that with the laser beam focused to about 25 μm the image of defects on the wafer is resolved to between 50 and 250 μm.

Further details of the bifurcated electrode and ground electrode are illustrated in the cross-section of FIG. 4. A resin-filled board 90 serves as a support for the bifurcated electrode 70 and the ground electrode 76. The resin-filled board is insulating and is as thin as possible, consistent with the requirement of mechanical stability. A slit 92 of about 250 μm in width is cut along a portion of the resin-filled board 90. The slit 92 does not extend to the ends of the board 90 in order to provide mechanical integrity. The electrodes 70 and 76, of a conductive material like aluminum, are deposited onto the board 90 in the pattern illustrated in FIG. 2. The width of each arm of the bifurcated electrode 70 is about 1,000 μm, although this dimension can be varied between 250 and 2,500 μm. The width of the arms of the ground electrode 76 are made the same as that of the arms of the bifurcated electrode 70 but, if desired, can be made much wider.

In use, both ends of the board 90 are mechanically fixed and the wafer 68 slowly passes beneath the electrode assembly. It has been found that a separation of 50 to 500 μm between the electrodes 70 and 76 and the upper surface of the wafer 68 produces good resolution of defects in the photovoltage image. The contrast of the image can be optimized by varying the surface potential induced by the corona discharge station. The corona current can be varied to yield differing amounts of ultraviolet radiation and ionized gas current and the voltage on the meshes 42 and 46 can be varied. It has been found that operating the meshes at ±20 V produces high contrast images but voltages between 5 and 100 V may be employed depending upon the sample. Signal optimization is believed to be based upon depleting the surface of the semiconductor 10 of majority carriers but not so much as to heavily accumulate a minority charge. That is, to produce an optimum image, the valence and conduction bands 12 and 14 should be bent sufficiently by the corona induced charge 20 and 22 so that the Fermi level 16 lies approximately at midgap at the interface.

Two preamplifier options are illustrated in FIGS. 5 and 6. Both the voltage mode illustrated in FIG. 5 and the current mode illustrated in FIG. 6 use an operational amplifier integrated circuit and operate in accordance with basic operational amplifier theory. (Reference "Operational Amplifiers—Theory and Practice" by Roberge and published by Wiley). In FIG. 5, the electrode charge 82 causes a current 102 to flow through a resistor 104, connected between the noninverting input of an operational amplifer 106 and ground, producing a voltage drop $E_{in}$ 108. The output of the amplifier 106 is directly connected to its inverting input. A preamplifier 72a thus has a voltage gain of one and, therefore, the output voltage $E_o$ 110 will equal the voltage drop $E_{in}$ 108. A current mode preamplifier 72b shown in FIG. 6 has its inverting input 112 of an operational amplifier 114 at virtually the same potential as its non-inverting input 116 which is common ground. The electrode charge 82 causes a current $I_{in}$ 118 to flow into a node 120 connected to the inverting input 112 and separated from the output of the amplifier 114 by a resistor 122. Since the input impedance of the inverting input 112 is very high compared to common ground, an equal current $I_R$ 124 leaves the node 120 and flows through the resistor 122 producing an output voltage $E_o$ 126. The current mode preamplifier 72b of FIG. 6 is the preferred configuration since it is a low impedance circuit and hence exhibits higher signal to noise ratio, higher gain-bandwidth, and lower susceptibility to externally generated noise.

Different embodiments of the invention will now be described. It is possible to operate with a linear electrode having a single arm instead of the bifurcated electrode 70 by eliminating one arm of the bifurcated electrode 70. While this embodiment is simpler, it reduces the available detected signal by approximately 50%, and causes a non-symmetric distortion of the photovoltage image. One method of eliminating this distortion at the expense of reduced laser transmission and increased detector impedance is to deposit a conductive material such as indium tin oxide, which is transparent to the laser beam, onto optical quality quartz. The slit 92 can be eliminated, and the electrode 70 becomes a rectangle approximately 1000 $\mu$m wide by a length equal to the wafer diameter. The laser beam is positioned at the center of the electrode 70 and is scanned along its entire length as before. The ground electrode 76 can be made from any conductive material.

The ground electrode 76 surrounding the bifurcated electrode is a ground plane which is spaced 100–1000 $\mu$m above the wafer 68. This ground electrode 76 is connected to the ground return on the preamplifier 72. The wafer 68 is insulated from ground so that the ground plane electrode 76 determines the potential on the wafer 68. An additional ground plane above the bifurcated electrode 70 will reduce noise in the signal.

Although imaging of defects in p-type silicon wafers has been described in the preferred embodiment, it is to be understood that the method can be extended to n-type silicon and even to other types of semiconductor material by appropriate changes in the corona discharge conditions. For use with p-type silicon, the upper discharge rod 34 is connected to a positive high voltage source 36 and the lower discharge rod 35 is connected to a negative high voltage source 37. In the case of n-type silicon, the upper and lower discharge rods 34 and 35 are connected to negative and positive high voltage supplies, respectively.

Although it is recommended that both sides of the wafer 68 be subjected to corona charging or pre-treatment, it is nonetheless possible to obtain satisfactory imaging by charging only one side of the wafer. In that case, however, a ground plane needs to be established on the uncharged side of the wafer.

It has been discovered that the surface conductivity of the wafer can be increased and an improved resolution obtained if an auxiliary DC light source floods the area of the wafer being scanned by the laser beam. In order to reduce noise, the DC power supply to the DC light source should be regulated. It is believed that the increased surface conductivity produces an increased coupling of the surface photo voltage to the bifurcated electrode. This method improves resolution at the expense of reduced contrast.

The detection technique described for the preferred embodiment is a DC illumination technique in which the charge on the bifurcated electrode 70 is measured and variations in that signal are imaged in the display system. The sensitivity of detection can be increased by instead using an AC illumination technique in which the laser beam is chopped at a given frequency and then the detection system detects signals only at that frequency. With acousto-optical techniques, the chopping can be performed in the range of 10 to 50 MHz.

The photovoltaic imaging, as practiced in this invention, is far superior to the electrical tests in characterizing recombination center defects in silicon wafers. The test is both fast and non-destructive and allows the characterization of every wafer put through the fabrication line. Furthermore, the photovoltaic test is able to probe the entire wafer surface and to image the defects in order that they may be characterized and identified. No special wafer preparation is required for the photovoltaic test. Tests can be made on wafers at the incoming inspection and also after the first several high temperature processing steps.

It has been found that the test can be used with partially fabricated wafers and even with wafers whose fabrication has been completed, including metallization. The patterns of the fabrication show in the imaging but the underlying defects show through as well. It is also possible to image the unfabricated side of a wafer. This technique would detect slip-lines extending through the wafer from the fabricated side. The backside inspection has the advantage of suppressing the fabricated circuit patterns.

We claim:

1. A method for imaging defects in a semiconductor body, comprising the steps of:
    oxidizing a first surface of said semiconductor body;
    exposing said oxidized first surface to an ionized gas held at a fixed electrical potential;
    passing said body beneath a stationary linear electrode separated from said exposed first surface, said linear electrode extending linearly substantially transverse to the direction in which said body is passed and being substantially surrounded by a ground electrode disposed in a plane parallel to the plane in which said body is passed;
    scanning a focused beam of light in proximity to said linear electrode and along its length onto said first surface; and
    detecting the signal on said linear electrode referenced to said ground electrode.

2. A method for imaging as recited in claim 1, wherein said linear electrode is a bifurcated electrode having two arms separated by a linear aperture substantially transverse to the direction in which said body is passed and said beam is scanned through said aperture.

3. A method for imaging as recited in claim 2, wherein the step of exposing comprises passing said body between two opposed corona discharges.

4. A method for imaging as recited in claim 2, further comprising the step of exposing a second surface of said semiconductor body opposed to said first surface to an ionized gas held at a fixed electrical potential.

5. A method for imaging as recited in claim 2, further comprising the step of directing light over a large area of said first surface during the scanning of said area.

6. A method for imaging as recited in claim 2, further comprising the step of chopping said beam of light at a predetermined frequency and wherein said detecting step is referenced to said frequency.

7. A method for imaging as recited in claim 4, wherein the steps of exposing comprise passing said body between two opposed corona discharges.

8. A method for imaging as recited in claim 7, further comprising the steps of:
    displaying said detected signal on a two-dimensional display;
    synchronizing one dimension of said display with the scanning of said beam; and
    synchronizing the other dimension of said display with the passing of said body beneath said bifurcated electrode.

9. A defect imaging system for a semiconductor body, comprising:
   means for exposing an oxidized surface of said body to an ionized gas held at a fixed electrical potential;
   a linear electrode;
   a light source for providing a light beam;
   means for scanning said beam in the proximity of said linear electrode and along its length onto said charged oxidized surface;
   means for moving said body substantially transverse to the length of said linear electrode with said charged oxidized surface in proximity to but separated from said linear electrode; and
   a detector for detecting charge induced on said linear electrode by the movement of said body relative to said electrode.

10. A defect imaging system as recited in claim 9, wherein said linear electrode is a bifurcated electrode having two arms and a linear aperture between said arms and said scanning means scans said beam through said aperture.

11. A defect imaging system as recited in claim 10, wherein said means for exposing comprises a corona discharge device.

12. A defect imaging system as recited in claim 10, wherein:
   said exposing means includes means for exposing two opposed surfaces to said ionized gas held at fixed potentials on the sides of said surfaces.

13. A defect imaging system as recited in claim 10, further comprising a reference electrode having two arms substantially in the plane of the arms of said bifurcated electrode and substantially surrounding said bifurcated electrode on the two sides along the length of said aperture, said reference electrode being held at a reference potential used by said detector.

14. A defect imaging system as recited in claim 10, further comprising a two-dimensional display for the output of said detector, synchronized in one dimension to the scanning means and synchronized in the other dimension to the moving means.

15. A defect imaging system for a semiconductor body, comprising:
   two corona discharge devices;
   a bifurcated electrode having two arms with a linear aperture therebetween;
   a reference electrode having two arms substantially in the plane of the two arms of said bifurcated electrode and substantially surrounding said bifurcated electrode on the two sides parallel to said linear aperture, said reference electrode being held at a fixed potential;
   a source of a beam of light;
   means for directing said beam through the aperture of said bifurcated electrode onto an oxidized surface of said body;
   means for scanning said beam along the length of said aperture;
   means for moving said body having at least one oxidized surface between said corona discharge devices and for moving said body substantially in the plane of the two arms of said bifurcated electrode and transversely to said aperture and maintaining said oxidized surface in proximity to but not touching said bifurcated electrode;
   a detector for charge induced on said bifurcated electrode, referenced to said fixed potential; and
   a two-dimensional display connected to the output of said detector, one dimension of which is synchronized to said scanning means and the other dimension of which is synchronized to said moving and maintaining means.

16. A defect imaging system as recited in claim 9, wherein said detector detects said induced charge relative to a fixed potential.

* * * * *